United States Patent [19]

Sigmund et al.

[11] Patent Number: 5,262,358
[45] Date of Patent: Nov. 16, 1993

[54] METHOD FOR PRODUCING A SILICATE LAYER IN AN INTEGRATED CIRCUIT

[75] Inventors: Hermann Sigmund, Germering; Armin Klumpp, Munich, both of Fed. Rep. of Germany

[73] Assignee: Fraunhofer-Gesellschaft zur Förderung der angewandten Forschung e.V., Munich, Fed. Rep. of Germany

[21] Appl. No.: 856,062
[22] PCT Filed: Nov. 9, 1990
[86] PCT No.: PCT/DE90/00857
§ 371 Date: Jun. 22, 1992
§ 102(e) Date: Jun. 22, 1992
[87] PCT Pub. No.: WO91/07774
PCT Pub. Date: May 30, 1991
[51] Int. Cl.$^5$ .......................... H01L 21/02
[52] U.S. Cl. .................. 437/235; 437/238; 437/240; 437/964; 148/DIG. 118; 148/DIG. 98; 148/DIG. 170
[58] Field of Search ............ 437/235, 238, 240, 964; 148/DIG. 98, DIG. 118, DIG. 170

[56] References Cited

U.S. PATENT DOCUMENTS

| | | | |
|---|---|---|---|
| 4,702,936 | 10/1987 | Maeda et al. | 437/238 |
| 4,781,942 | 11/1988 | Leyden et al. | 427/54.1 |
| 5,028,566 | 7/1991 | Lagendijk | 437/238 |

FOREIGN PATENT DOCUMENTS

| | | |
|---|---|---|
| 0283311 | 9/1988 | European Pat. Off. . |
| 1-98033 | 8/1989 | Japan . |
| 2048230 | 12/1980 | United Kingdom . |
| 2094280 | 9/1982 | United Kingdom . |

OTHER PUBLICATIONS

Baker et al.; "Photoenhanced Deposition of Silicon Oxide Thin Films Using a Novel Windowless Internal Nitrogen Discharge Lamp"; Appl. Phys. A vol. 46; pp. 243–248; 1988.
Chin et al.; "Plasma TEOS Process for Interlayer Dielectric Applications"; Solid State Technology; pp. 119–122; Apr. 1988.
Jackson et al.; "Afterglow Chemical Vapor Deposition of SiO$_2$"; Solid State Technology; pp. 107–111; Apr. 1988.
Levy et al.; "Low Pressure Chemical Vapor Deposition of Borophosphosilicate Glass Films Produced by Injection of Miscible DADBS-TMB-TMP Liquid Sources; J. Electrochem. Soc. Solid-State Science and Technology"; pp. 1744–1749; Jul. 1987.
Butherus et al.; "O$_2$ Plasma-Converted Spin-On-Glass for Planarization"; J. Vac. Sci.-Technol B3(5); pp. 1352–1356; Sep./Oct. 1985.
"Radiation-Curable Polysiloxanes"; IBM Technical Disclosure Bulletin; vol. 30, No. 3, Aug. 1987.
Kulisch et al.; "Plasma-Enhanced Chemical Vapour Deposition of Silicon Dioxide Using Tetraethoxysilane as Silicon Source"; Thin Solid Films, vol. 174, No. 1, Jul. 1989, pp. 57–61.

Primary Examiner—Tom Thomas
Assistant Examiner—Trung Dang
Attorney, Agent, or Firm—Ralph H. Dougherty

[57] ABSTRACT

A silicate layer, which is especially used as an intermediate oxide insulation layer in an integrated circuit for levelling topographic irregularities, is produced by the following method steps: photo-induced polymerization of polysiloxane by means of vapor-phase reaction taking as a basis an SiO-containing or an SiC-containing organic compound together with an O$_2$-containing and/or an N$_2$O-containing gas at a first temperature and under a first pressure in a reaction chamber; condensing polysiloxane to produce a polysiloxane layer on a structure, in particular on the circuit structures of the integrated circuit, in a condensation chamber separated from said reaction chamber at a second temperature, which is lower than said first temperature and which is at least high enough to prevent the SiO- or SiC-containing organic compound from condensing under a predetermined second pressure in the condensation chamber, but which is higher than the temperature at which polysiloxane will condense under said second pressure; and converting the polysiloxane layer into the silicate layer.

8 Claims, 1 Drawing Sheet

METHOD FOR PRODUCING A SILICATE LAYER IN AN INTEGRATED CIRCUIT

The present invention relates to a method of producing a silicate layer in an integrated circuit.

Silicate layers provided within integrated circuits are normally used as intermediate oxide insulation layers for electrically insulating the polysilicon plane and the diffusion areas located below the intermediate oxide insulation layer from the conductor tracks which are arranged above the intermediate oxide insulation layer and which may consist, e.g., of aluminum. Furthermore, the interradiate oxide insulation layer is used for making uniform or for rounding off topographic irregularities of the circuit structures formed on the substrate before the polysilicon structure is formed. The vertical steps of the circuit structures must be rounded off and levelled as much as possible by the intermediate oxide insulation layer, since otherwise shadowing effects may occur when the aluminum conductor tracks are produced by means of a subsequent aluminum sputtering process, and since, in addition, excessively high steps in the substrate may result in overhangs and in tearing of the aluminum conductor tracks. When the integration level of the integrated circuit increases, these problems become more and more critical, since, due to the fact that the lateral dimensions decrease as the integration level increases, the height-width ratio increases while the layer thickness of the topographic steps remains unchanged.

For the consequently necessary levelling of structured surfaces of integrated circuits, two methods are primarily used at present:

According to the first known method, a polysiloxane layer is applied by means of a spin-on process to the topologically uneven circuit structures formed on a substrate. The polysiloxane layers applied in this way are also referred to as spin-on glass (SOG). After having been applied by the spin-on process, the polysiloxane layer is converted into a silicate layer or $SiO_2$ layer in a subsequent tempering process. In the case of this method, the chemical composition of the polysiloxane layer cannot be varied and the flow behavior and the viscosity of the polysiloxane layer as well as the layer thickness thereof can only be adjusted within close limits. When polysiloxane layers are applied by means of the spin-on process, it is technologically very difficult to produce thin layers and layers having a homogeneous thickness throughout large wafer diameters. Furthermore, it is impossible to adapt the chemical composition and, consequently, the viscosity as well as the flow properties of commercially available polysiloxanes to the requirements of a special topography of the integrated circuit, as can be necessary, for example, for filling a trench, since the adaptation of the composition and of the flow properties of the polysiloxanes can only be carried out through the manufacture thereof.

In the second known method, boron phosphorous silicate glass layers are produced in a chemical vapor deposition process (CVD) as intermediate insulation layers. This vapor deposition process uses as starting gases preferably silane compounds or organic siloxane compounds together with doping gases, such as $B_2H_6$ and $PH_3$, respectively, as well as oxygen ($O_2$). These boron phosphorus silicate glass layers can be deposited by means of a purely thermal reaction at atmospheric pressure or in the low pressure range as well as in plasma. The boron phosphorus silicate glass layers have high flow temperatures and, consequently, they result in a high temperature budget in the overall production process. Furthermore, in order to prevent diffusion of boron or of phosphorus, additional diffusion-retarding cover layers, such as silicon nitride layers, have to be used, and this burdens the overall production process. Moreover, due to their complex chemical structure and composition boron phosphorus silicate glass layers are difficult to handle when subsequent process steps, such as etching of contact holes, are carried out.

The technical publication "Solid State Technology, April 1988, pages 119 to 122", discloses a PE-TEOS (plasma enhanced -tetraethyl orthosilicate) process of producing a dielectric intermediate layer. In the case of this process $SiO_2$ is deposited. The production of the species is effected by plasma ignition in the gas chamber. The reaction of the species on the wafer surface takes place at temperatures above 300° C. This will result in an adsorption-controlled reaction on the basis of which the wafer surface will be provided with a conform cover.

GB 2 048 230 discloses a method for photochemical vapor deposition of oxides. one variant of the known method uses as starting materials an oxygen donor as well as TEOS. As far as the reference discloses details with regard to the reaction sequence, the reaction sequence of the known method seems to be a diffusion-limited deposition.

DE-A-34 16 470 shows a so-called dry process, and this refers to an etching process used for uniformly etching semiconductor structures or to chemical vapor deposition (CVD) of amorphous silicon. In the case of a deposition of amorphous silicon, an apparatus with separate chambers is provided, a discharge shower means being disposed between the chambers so as to produce a pressure difference, and polymerization is caused by means of light excitation by an external light source. The process according to this publication neither aims at optimizing the levelling of topographic irregularities by means of an intermediate oxide insulation layer, nor does it deal with a reaction sequence which is completely finished within one spatial region, nor are the temperature and pressure conditions in this process selected so that condensation of the products formed will occur in the lower chamber of the apparatus.

EP-A-28 33 11 discloses a thin-film production process which, for the purpose of filling trenches, a deposition of the starting material on the substrate in the liquid phase takes place due to an adjustment of the substrate temperature to a sufficiently low value. This publication teaches the person skilled in the art not to use the TEOS process assessed in the introduction to the specification of this publication, since this publication avers that the process is unsuitable for levelling topographic irregularities, and it teaches to directly deposit instead a starting substance as a liquid film, the contributions of the vapor phase reaction being of secondary importance in the process according to this publication.

SUMMARY OF THE INVENTION

It is the principal object of the present invention to provide a method for producing silicate layers, in such a way that a silicate layer formed will level topographic irregularities to a large extent, and will be adapted to be produced with a uniform, determinable layer thickness throughout large surfaces, and in such a way that the flow behavior of the deposited polysiloxane layer can be adjusted freely.

BRIEF DESCRIPTION OF THE DRAWINGS

The foregoing and other objects will become more readily apparent by referring to the following detailed description and the appended drawings, in which.

DETAILED DESCRIPTION OF THE INVENTION

Figure 1:
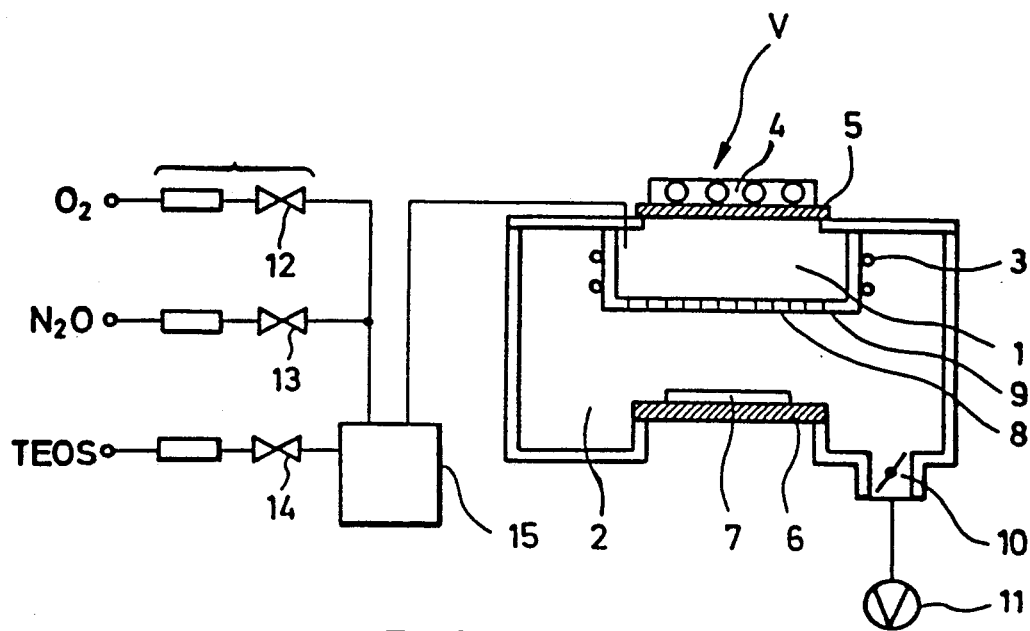
FIG. 1 is a schematic diagram of an apparatus for producing a silicate layer according to the present invention, the apparatus being suitable for carrying out the method according to the present invention.

The apparatus shown in FIG. 1, which is used for producing a silicate layer as an intermediate oxide insulation layer in an integrated circuit for levelling topographic irregularities of circuit structures formed on a substrate of the integrated circuit, is identified by reference symbol V in its entirety, and comprises a reaction chamber 1 as well as a condensation chamber 2. The reaction chamber 1 is adapted to be heated by means of a heating device in the form of a heating coil 3 and it is adapted to be irradiated by a light source for ultraviolet light, which is separated from the reaction chamber 1 by a glass plate 5, preferably an optical quality fused quartz, such as sold under the Trademark SUPRASIL, by Heraeus Amersil, Inc., of Sayresville, New Jersey. The condensation chamber 2 has provided therein an electrically heatable reception device 6 for a semiconductor wafer to be coated, the semiconductor wafer being a silicon wafer 7 in the case of the present example.

Between the reaction chamber 1 and the condensation chamber 2 a discharge shower means 8 is located, the flow-through openings 9 of the discharge shower means 8 having a cross-section of such a nature that the pressure within the condensation chamber 2 is less than 100 mbar lower than the pressure within the reaction chamber 1.

The condensation chamber 2 is connected, via a control valve 10, to a pump 11 with the aid of which the condensation chamber can be evacuated to a pressure level which is adapted to be adjusted by means of the control valve 10.

A gas containing $O_2$ can be supplied to the reaction chamber 1 via a first flow control valve 12. A gas containing $N_2O$ can be supplied to the reaction chamber 1 via a second flow control valve 13. An SiO-containing compound, which is preferably tetraethyl orthosilicate, can be supplied to the reaction chamber via a third flow control valve 14. A vaporizer 15 for vaporizing the tetraethyl orthosilicate, which is supplied in the liquid state, is located between the flow control valves 12, 13, 14 and the reaction chamber 1.

The flow control valves 12, 13, 14 are adjusted such that the mixing ratio of the gases supplied, e.g. tetraethyl orthosilicate : $O_2$ : $N_2O$, corresponds to the ratio 3 : 10 : 10 with the proviso that normal conditions (1 bar, 300 K) exist.

By adequately adjusting the heating power of the heating coil 3, the reaction temperature is adjusted to a temperature of from 120° to 150° in a pressure range of from preferably 100 to 800 mbar reaction pressure.

By adequately adjusting the heating power of the reception device 6, the condensation temperature, which corresponds to the temperature of the silicon wafer 7, is adjusted to a range between 30° and 90° C.

Subsequently, the polysiloxane layer is converted into a silicate layer either in a purely thermal tempering process or in a photo-aided tempering process. Following this, the silicate layer thus produced can have applied thereto a structure of aluminum conductor tracks in a manner known per se.

In the method described above, tetraethyl orthosilicate is used as a precursor. Instead of using SiO-containing organic compounds as a precursor, it is also possible to use SiC-containing organic compounds.

The molecular formulae of the polysiloxanes for the two above-mentioned cases are as follows:

(1) $Si[O_{2x}(OH)_{4y}(OC_2H_5)_{4z}]$  $\quad x + y + z = 1$
 $\quad x, y, z \neq 0$

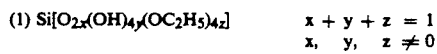

(2) $Si[O_{2x}(OH)_{4y}(CH_3)_{4z}]$  $\quad x + y + z = 1$
 $\quad x, y, z, \neq 0$

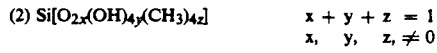

Formula (1) is applicable to cases in which TEOS Si-$(OC_2H_5)_4$ is used as a precursor.

Formula (2) is applicable to cases in which precursors containing ≡Si—C≡ bonds, such as hexamethyldisiloxane or tetramethylcyclotetrasiloxane, are used.

The following substances can be used as SiO-containing or SiC-containing organic compounds and as precursors, respectively:

I. alkyl silane, e.g. tetramethylsilane $Si(CH_3)_4$;

II. alkoxy silane, e.g. tetraethoxysilane (TEOS) $Si(OC_2H_5)_4$;

III. low-molecular siloxanes, e.g. hexamethyldisiloxane $Si_2O(CH_3)_6$; and

IV. low-molecular cyclosiloxanes, e.g. octamethylcyclotetrasiloxane $Si_4O_4(CH_3)_8$.

For the invented method, it is of decisive importance that, on the basis of a suitable choice of the temperature and pressure conditions, the polysiloxane will condense in the condensation chamber, whereas condensation of the precursor in the condensation chamber on the silicon wafer 7 is to be prevented. Hence, the temperature of the silicon wafer 7 is chosen such that the precursor will just be prevented from condensing under the given pressure within the condensation chamber, the temperature of the silicon wafer being, however, limited to such a value that condensation of the polysiloxane will be possible under the second pressure within the condensation chamber.

The first temperature within the reaction chamber depends on the precursor chosen and must be determined by experiments depending on the respective precursor which has been chosen. For the preferred precursor tetraethyl orthosilicate the preferred reaction temperatures lie between 120° and 150° C.

In contrast to the adsorption-controlled reaction which is normally employed in the prior art, the condensation of the polysiloxane on the surface of the silicon wafer will have the effect that structures having a negative radius of curvature will be filled preferably. This will result in an increased degree of planarization of the surface.

The invented method permits a production of the polysiloxane immediately prior to its use, and, via the choice of the precursor, it is possible to adapt the properties of the polysiloxane to the respective case of use.

The production of polysiloxane can be optimized by determining the conditions of the vapor-phase reaction in the separate reaction chamber, without there being any necessity of taking into account the necessary skeleton conditions for the condensation process in the condensation chamber. After the condensation of polysiloxane on the semiconductor surrace in a liquid phase, no further reaction will take place on the surface. This type of sequence of process steps is in contrast with the sequence of process steps in the case of the known processes, which were explained at the beginning.

Figure 2:
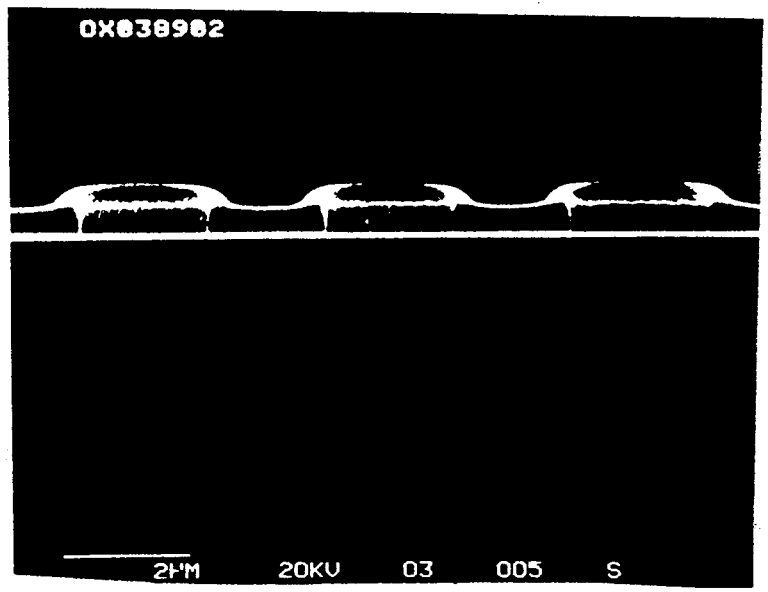
FIG. 2 is a sectional view through an integrated circuit with a flat trench structure after application of a silicate layer by means of the method of the present invention.

FIG. 2 shows a sectional view through a silicon wafer 7, which is provided with a flat trench structure and which has been coated with a silicate layer by means of the method according to the present invention, the topographic steps being levelled to a large extent by the silicate layer. In the invented method, the silicate layer is used for levelling topographic irregularities of circuit structures formed on a substrate of an integrated circuit. The silicate layers produced by the method according to the present invention are, however, nor limited to this case of use, but they can be employed quite generally as a dielectric for any kind of use.

We claim:

1. A method of producing a silicate layer as an intermediate oxide insulation layer in an integrated circuit for levelling topogaphic irregularities of circuit structures formed on a substrate of said integrated circuit, said method comprising the following steps:

photo-induced polymerization of polysiloxane by means of vapor-phase reaction taking as a basis an SiO-containing or an SiC-containing organic compound together with an $O_2$-atmosphere and/or an $N_2O$-atmosphere at a first temperature and under a first pressure in a reaction chamber;

condensing polysiloxane to produce a polysiloxane layer on the circuit structures of the integrated circuit formed on the substrate, in a condensation chamber separated from said reaction chamber;

said substrate being adjusted to a second temperature, which is lower than said first temperature and which is so selected that the SiO-containing or SiC-containing organic compound will no longer condense under a second pressure in the condensation chamber, but that condensation of the polysiloxane on the circuit structures of the integrated circuit formed on said substrate will take place; and tempering said polysiloxane layer into the silicate layer whereby it is converted into the silicate layer.

2. A method according to claim 1 characterized in that the first temperature lies in the range between 120° C. and 150° C.

3. A method according to claim 1, characterized in that the second temperature lies in the range between 30° C and 90° C.

4. A method according to claim 1, characterized in that the first pressure lies between 100 mbar and 800 mbar, and that the second 5. A method according to claim 1, characterized in that the method step of photo-induced polymerization of polysiloxane comprises the step of supplying the starting materials via separate flow control means (12 to 14) as well as the step of vaporizing the SiO-containing organic compound.

6. A method according to claim 1, characterized in that the SiO-containing organic compound is tetraethyl orthosilicate ($Si(OC_2H_5)_4$).

7. A method according to claim 1, characterized in that the polysiloxane layer is converted into the silicate layer in a purely thermal tempering process.

8. A method according to claim 1, characterized in that the polysiloxane layer is converted into the silicate layer in a photo-aided tempering process.

* * * * *